United States Patent
Kipnis et al.

(10) Patent No.: US 9,559,714 B2
(45) Date of Patent: Jan. 31, 2017

(54) ANALOG-TO-DIGITAL COMPRESSION

(71) Applicant: The Board of Trustees of the Leland Stanford Junior University, Palo Alto, CA (US)

(72) Inventors: Alon Kipnis, Palo Alto, CA (US); Andrea Goldsmith, Menlo Park, CA (US); Yonina C. Eldar, Haifa (IL)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 15/136,744

(22) Filed: Apr. 22, 2016

(65) Prior Publication Data
US 2016/0315631 A1    Oct. 27, 2016

Related U.S. Application Data
(60) Provisional application No. 62/152,764, filed on Apr. 24, 2015.

(51) Int. Cl.
*H03M 1/12* (2006.01)

(52) U.S. Cl.
CPC ............. *H03M 1/1245* (2013.01); *H03M 1/12* (2013.01); *H03M 1/124* (2013.01)

(58) Field of Classification Search
CPC ....... H03M 1/1245; H03M 1/12; H03M 1/124
USPC .................................................. 341/155, 123
See application file for complete search history.

(56) References Cited

U.S. PATENT DOCUMENTS

| | | | |
|---|---|---|---|
| 4,227,204 A | 10/1980 | Rossi | |
| 7,012,556 B2 | 3/2006 | Dean et al. | |
| 7,091,894 B2 | 8/2006 | Fudge et al. | |
| 7,173,555 B2 | 2/2007 | Raz | |
| 7,259,547 B1* | 8/2007 | Summers | G01R 19/2509 324/141 |
| 7,515,078 B2* | 4/2009 | May | H03H 17/0671 341/143 |
| 8,064,560 B2* | 11/2011 | Hunter | G01S 13/788 375/326 |
| 8,300,680 B2* | 10/2012 | Pals | H04B 1/28 341/155 |
| 8,861,588 B2 | 10/2014 | Nguyen et al. | |

OTHER PUBLICATIONS

Aziz, Pervez M., Henrik V. Sorensen, and J. Van der Spiegel. "An overview of sigma-delta converters", IEEE Signal Processing Magazine, vol. 13, No. 1, 1996, pp. 61-84.
(Continued)

*Primary Examiner* — Brian Young
(74) *Attorney, Agent, or Firm* — Mintz Levin Cohn Ferris Glovsky and Popeo, P.C.

(57) ABSTRACT

In one respect, there is provided a method for analog-to-digital conversion. The method may include: receiving, at an analog-to-digital converter, an analog signal; determining, based on a total distortion caused by at least a sampler and an encoder, a sampling rate below the Nyquist rate and/or a quantization rate; and converting, by the analog-to-digital converter, the received analog signal to a digital signal by at least sampling at the determined sampling rate, when operation at the determined sampling rate does not worsen the total distortion. Related systems and articles of manufacture are also disclosed.

20 Claims, 8 Drawing Sheets

(56) References Cited

OTHER PUBLICATIONS

Bennett, W. R., "*Spectra of Quantized Signals*," Bell System Technical Journal, pp. 446-472.

Berger, Toby, and Jerry D. Gibson, "Lossy source coding," IEEE Transactions on Information Theory, vol. 44, No. 6, 1998, pp. 2693-2723.

Berger, Toby. "Rate Distortion Theory: A Mathematical Basis for Data Compression" Encyclopedia of Telecommunications. New Jersey, 1971.

Cvetkovic, Zoran and Martin Vetterli, "On simple oversampled A/D conversion in L 2 (R)," IEEE Transactions on Information Theory, vol. 47, No. 1, 2001, pp. 146-154.

de la Rosa, Jose M., "Sigma-delta modulators: Tutorial overview, design guide, and state-of-the-art survey," IEEE Transaction on Circuits and Systems 1: Regular Papers, vol. 58, No. 1, 2011, pp. 1-21.

Eldar, Yonina C., and Tomer Michaeli "Beyond bandlimited sampling," IEEE Signal Processing Magazing, vol. 26, No. 3, 2009, pp. 48-68.

Gray, Robert M., "Quantization noise spectra," IEEE Transactions on Information Theory, vol. 36, No. 6, 1990, pp. 1220-1244.

Gray, Robert M., and David L. Neuhoff, "Quantization," IEEE Transaction on Information Theory, vol. 44, No. 6, 1998, pp. 2325-2383.

Kipnis, Alon, Andrea J. Goldsmith, and Yonica C. Eldar, "Optimal trade-off between Sampling Rate and quantization precision in A/D conversion," 53rd Annual Allerton Conference on Communication, Control, and Computing. Illinois, 2015.

Kipnis, Alon, Andrea J. Goldsmith, and Yonina C. Eldar, "Sub-Nyquist sampling achieves optimal rate-distortion," Information Theory Workshop (ITW), 2015 IEEE. IEEE, 2015, pp. 1-5.

Kipnis, Alon, et al., "Distortion-Rate Function of Sub-Nyquist Sampled Gaussian Sources," IEEE transactions on information theory, 2016, pp. 401-429.

Kolmogorov, Andrei N., "On the Shannon Theory of Information Transmission in the Case of Continuous Signals," IRE Transactions on Information Theory, 1956, pp. 102-108.

Lloyd, Stuart, "Least squares quantization in PCM," IEEE transactions on information theory, vol. 28, No. 2, 1982, pp. 129-137.

Neuhoff, David L. and Pradhan, S. Sandeep, "Information Rates of Densely Sampled Data: Distributed Vector Quantization and Scalar Quantization With Transforms for Gaussian Sources," IEEE Transactions on Information Theory, vol. 59, No. 9, 2013, pp. 5641-5664.

Oliver, B. M., J. R. Pierce, and Claude E. Shannon, "The philosophy of PCM," Proceedings of the IRE, vol. 36, No. 11, 1948, pp. 1324-1331.

Pinsker, M. S. "Information and information stability of random variables and processes," Translated and edited by Amiel Feinstein Holden-Day, Inc., London-Amsterdam xii, San Francisco, 1964, p. 243.

Thao, Nguyen T. and Vetterli, Martin, "Lower Bound on the Mean-Squared Error in Oversampled Quantization of Periodic Signals Using Vector Quantization Analysis," *IEEE Transactions on Information Theory*, vol. 42, No. 2, 1996, pp. 469-479.

Thao, Nguyen T., and Martin Vetterli, "Lower bound on the mean squared error in multi-loop sigma-delta modulation with periodic bandlimited signals," Signals, Systems and Computers, 1994. 1994 Conference Record of the Twenty-Eighth Asilomar Conference on, vol. 2, 1994, pp. 1536-1540.

Thao, Nguyen T., and Martin Vetterli, "Reduction of the MSE in R-times oversampled A/D conversion O (1/r) to O (1/r2)," IEEE Transactions on Signal Processing, vol. 42, No. 1, 1994, pp. 200-203.

Viswanathan, Harish and Zamir, Ram, "On the Whiteness of High-Resolution Quantization Errors," IEEE Transactions on Information Theory, vol. 47, No. 5, 2001.

Widrow, Bernard, "A Study of Rough Amplitude Quantization by Means of Nyquist Sampling Theory," IRE Transactions on Circuit Theory, pp. 266-276, 1956.

Goldsmith, Andrea. "Fundamental Performance Limits of Analog to Digital Conversion". Wireless System Laboratory, Stanford University. ITA Workshop, La Jolla. Feb. 2, 2015.

\* cited by examiner

ANALOG-TO-DIGITAL COMPRESSION

CROSS REFERENCE TO RELATED APPLICATIONS

This application claims priority to U.S. Provisional Patent Application No. 62/152,764 filed Apr. 24, 2015, entitled "ANALOG-TO-DIGITAL CONVERSION USING THE OPTIMAL SAMPLING RATE AND BIT ALLOCATION STRATEGY FOR A PRESCRIBED BITRATE," the contents of which is hereby incorporated by reference in its entirety.

TECHNICAL FIELD

The subject matter disclosed herein relates to communications and more specifically to signal processing.

BACKGROUND

An analog signal may be continuous in both value and time. That is, an analog signal may be associated with a value (e.g., amplitude) for every instant in time. Moreover, an analog signal may take on any value from an infinite set of possible values (e.g., all real numbers $\mathbb{R}$ or all real $\mathbb{R}$ numbers within a limited range). By contrast, a digital signal may be a discrete-time sequence of values from a finite set of values.

Thus, in order to convert an analog signal to a digital signal, the analog signal may be sampled at a certain sampling rate $f_s$. For example, the value (e.g., amplitude) of the analog signal may be determined at each uniformly placed sampling interval $$T = \frac{1}{f_s}$$

(e.g., every x microseconds). Converting an analog signal to a digital signal may further include encoding each sample of the analog signal. Specifically, a quantizer (e.g., scalar, vector) may be applied to map the value of each sample from an infinite set of values to a finite set of values.

Analog to digital conversion may introduce distortion that prevents perfect or alias-free reconstruction of an original analog signal from its digital representation. According to the Shannon-Nyquist sampling theorem, the fidelity of a reconstructed analog signal relative to the original analog signal may depend on the sampling rate applied during analog-to-digital conversion. In particular, the theorem proposes that a bandlimited analog signal may be perfectly reconstructed from uniform samples of the signal taken at a sampling rate at or above the Nyquist rate $f_{Ny}$, where $f_{Ny}$ is twice the bandwidth B of the analog signal. As such, conventional analog-to-digital converters are typically configured to avoid distortion by sampling at or above the Nyquist rate $f_{Ny}=2B$.

SUMMARY

Methods, systems, and articles of manufacture, including computer program products, are provided for analog-to-digital compression.

In some example embodiments, there is provided a method that includes: receiving, at an analog-to-digital converter, an analog signal; determining, based on a total distortion caused by at least a sampler and an encoder, a sampling rate below the Nyquist rate and/or a quantization rate; and converting, by the analog-to-digital converter, the received analog signal to a digital signal by at least sampling at the determined sampling rate, when operation at the determined sampling rate does not worsen the total distortion.

In some variations, one or more of the features disclosed herein including the following features can optionally be included in any feasible combination. The system may be further configured to convert, by the analog-to-digital converter, the received analog signal to the digital signal by at least encoding at the determined quantization rate. The analog-to-digital converter may comprise the sampler and the encoder. The total distortion may include a first distortion associated with the sampling of the analog signal and a second distortion associated with the encoding of the analog signal. The second distortion associated with the encoding of the analog signal may represent a minimal distortion achievable by the analog-to-digital converter. The minimal distortion may correspond to an operating point at which the sampling rate does not worsen the total distortion. The encoder may quantize a sampled representation of the received analog signal. The encoder may comprise a scaler quantizer and/or a vector quantizer. The system may be further configured to determine the total distortion based on feedback representative of a distortion of the decoded digital signal and/or an error of the decoded digital signal. The system may be further configured to determine, based on the feedback, an adapted sampling rate below the Nyquist rate such that operation at the adapted sampling rate does not worsen the total distortion caused by the sampler and the encoder, and convert the received analog signal by at least sampling at the adapted sampling rate.

DESCRIPTION OF THE DRAWINGS

The patent or application file contains at least one drawing executed in color. Copies of this patent or patent application publication with color drawing(s) will be provided by the Office upon request and payment of the necessary fee.

The accompanying drawings, which are incorporated in and constitute a part of this specification, show certain aspects of the subject matter disclosed herein and, together with the description, help explain some of the principles associated with the disclosed implementations. In the drawings.

DETAILED DESCRIPTION

Analog-to-digital converters may, as noted above, be configured to operate at a sampling rate that is generally fixed so that it is sampled at or above the Nyquist rate (e.g., at least twice the bandwidth of the analog input signal being converted). After the analog input signal is sampled, an encoder quantizes the samples into digital data representative of the input. Sampling at or above the Nyquist rate is generally considered an inviolable operating principle.

In some example embodiments, there may be provided an analog-to-digital converter that is configured to operate at sampling rates less than the Nyquist rate. In some example embodiments, an analog-to-digital converter receives an analog signal. The sampling rate and/or the quantization rate may be optimized, so that the sampling rate below the Nyquist rate. This optimization may be performed based on the total distortion caused by the analog-to-digital converter's sampler and the analog-to-digital converter's encoder. In some instances, operating at the Nyquist sampling rate is sub-optimum because the distortion caused by the encoder and its associated quantization error or distortion is sufficient to enable sampling at sub-Nyquist sampling rates. In these instances, the analog-to-digital converter may be optimized by configuring the analog-to-digital converter to operate at less than the Nyquist sampling rate (although the quantization or code rate of the encoder may be varied as well). In this way, the analog-to-digital converter may, in accordance with some example embodiments, provide compression realized by operation at a lower sampling rate and/or lower quantization or code rate.

In some example embodiments, an analog-to-digital converter may be configured to adapt a sampling rate at which the analog-to-digital converter samples an analog signal. The analog-to-digital converter may introduce distortion when sampling and encoding the analog signal. The distortion introduced through encoding may be a minimal distortion achievable by the analog-to-digital converter. That is, the distortion that is introduced through encoding the analog signal may not be improved and/or eliminated by sampling the analog signal at a sampling frequency higher than the Nyquist rate. Thus, oversampling may occur when the analog-to-digital converter samples at or above the Nyquist rate. As such, the analog-to-digital converter may avoid oversampling by adapting to an optimal sampling rate. The optimal sampling rate may be below the Nyquist rate. Moreover, sampling at the optimal sampling rate may not introduce distortion (e.g., as a result of sampling) in addition to the minimal distortion achievable by the analog-to-digital converter.

In some example embodiments, an analog-to-digital converter may be configured to convert an analog signal $X(\bullet)$ to a digital signal by sampling and encoding the analog signal $X(\bullet)$. The analog-to-digital converter may sample the analog signal $X(\bullet)$ at a sampling rate $f_s$ to produce a discrete-time signal $Y[\bullet]$. The analog-to-digital converter may further encode the discrete-time signal $Y[\bullet]$ at a quantization rate q. For example, the quantization rate q may correspond to a quantity of bits that is used to encode each sample of the analog signal $X(\bullet)$ present in the discrete-time signal $Y[\bullet]$. Accordingly, the bitrate of the analog-to-digital converter may be a function of its sampling rate $f_s$ and quantization rate q.

In some example embodiments, the bitrate of the analog-to-digital converter may be subject to a bitrate constraint R. The bitrate constraint R may reflect the limitations (e.g., hardware) of the analog-to-digital converter in both sampling and encoding the analog signal $X(\bullet)$. For instance, the analog-to-digital converter may encode the discrete-time signal $Y[.]$ in a lossy manner (e.g., by using a q quantity of bits to encode each sample of the analog signal $X(\bullet)$). Thus, the bitrate constraint R of the analog-to-digital converter may be a function of the sampling rate $f_s$ and quantization rate q of the analog-to-digital converter (e.g., $R=f_s \times q$). Converting the analog signal $X(\bullet)$ may introduce a total distortion $D_X$ that is a function of the bitrate constraint R (e.g., $D_X(R)$). That is, an analog signal $\hat{X}(\bullet)$ reconstructed from the digital signal $Y[\bullet]$ may exhibit a total distortion $D_X(R)$ as a result of both the sampling and encoding of the original analog signal $X(\bullet)$.

In some example embodiments, the analog-to-digital converter may adapt the sampling rate $f_s$ when converting the analog signal $X(\bullet)$. The total distortion $D_X(R)$ may be subject to a lower bound $\underline{D}_X$ representative of a minimal distortion that may be achieved by the analog-to-digital converter given the bitrate constraint R. For instance, the minimal distortion achievable by the analog-to-digital converter may correspond to the distortion introduced through the encoding of the analog signal $X(\bullet)$. As such, sampling at or above the Nyquist rate $f_{Ny}$ (e.g., $f_s \geq f_{Ny}$) may not improve the total distortion $D_X(R)$ beyond the lower bound $\underline{D}_X$. Thus, there exist an optimal sampling rate $f_{DR}$ below the Nyquist rate $f_{Ny}$, where the total distortion $D_X(R)$ of analog-to-digital is equal to the minimal distortion $\underline{D}_X$. Accordingly, the analog-to-digital converter may sample at the optimal sampling rate $f_{DR}$ without introducing additional distortion (e.g., due to sampling) in excess of the minimal distortion (e.g., the lower bound $\underline{D}_X$) achievable by the analog-to-digital converter.

In some example embodiments, the analog-to-digital converter may be configured to adapt the bitrate constraint R when converting the analog signal $X(\bullet)$. For example, the analog-to-digital converter may adapt the bitrate constraint R by adjusting the quantization rate q. That is, the analog-to-digital converter may increase (or decrease) the quantity of bits used to encode each sample of the analog signal $X(\bullet)$ present in the discrete-time signal $Y[\bullet]$.

In some example embodiments, the analog-to-digital converter may adapt the bitrate constraint R based on a power spectral density $S_X(f)$ associated with the analog signal $X(\bullet)$. Increasing the bitrate constraint R may increase the portion of the analog signal $X(\bullet)$ that is preserved through encoding. By contrast, decreasing the bitrate constraint R may increase the portion of the analog signal $X(\bullet)$ that is discarded as a result of encoding. The analog-to-digital converter may adjust the bitrate constraint R such that the analog-to-digital converter may sample at an optimal sampling rate $f_{DR}$ (e.g., below the Nyquist rate $f_{Ny}$) without increasing the total distortion $D_X(R)$ above a minimal distortion (e.g., the lower bound $\underline{D}_X$).

Alternately or in addition, the analog-to-digital converter may adapt the bitrate constraint R based on the feedback from a receiver (e.g., a digital-to-analog-converter) of the digital signal $Y[n]$. The feedback may indicate a level of distortion present in an analog signal $\hat{X}(\bullet)$ reconstructed from the digital signal $Y[n]$.

Figure 1:
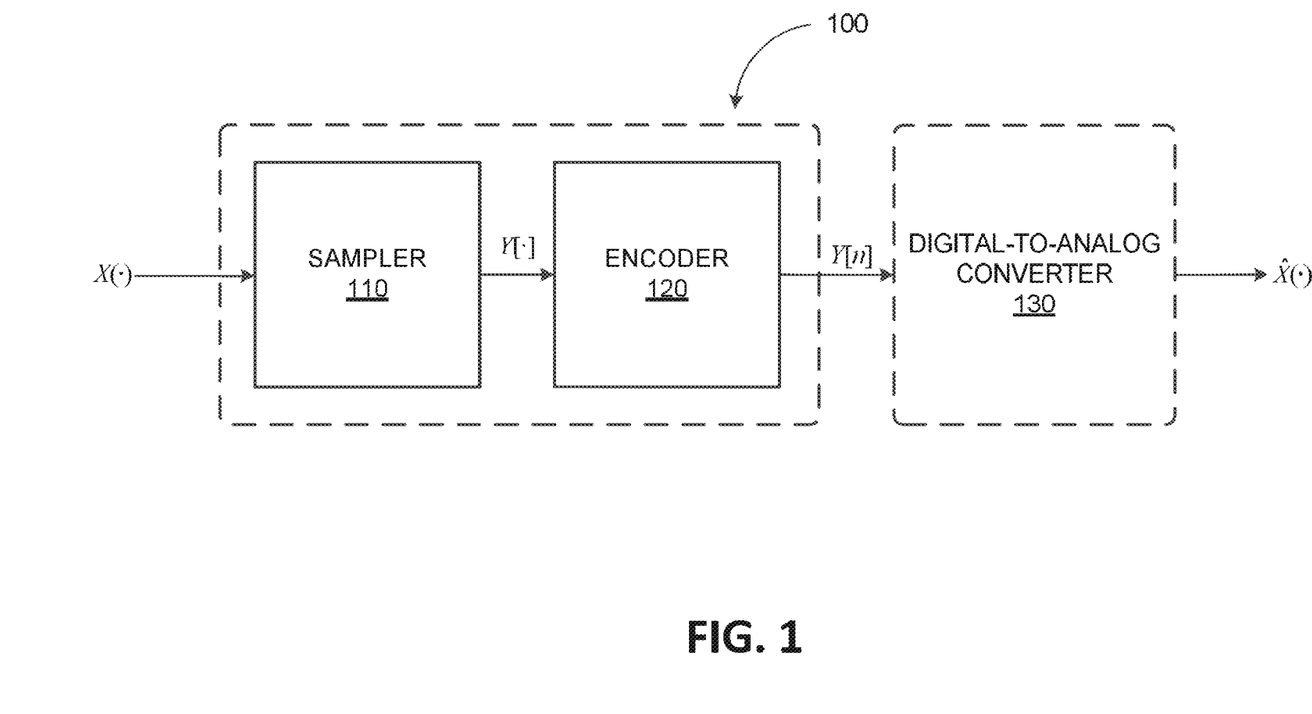
FIG. 1 depicts a block diagram illustrating an analog-to-digital converter, in accordance with some example embodiments.

FIG. 1 depicts a block diagram illustrating an analog-to-digital converter 100, in accordance with same example embodiments. Referring to FIG. 1, the analog-to-digital converter may include a sampler 110 and an encoder 120.

In some example embodiments, an analog signal X(•) may be input into the analog-to-digital converter 100. For example, the analog signal X(•) may a signal, which may be a Gaussian stationary process. The sampler 110 may be configured to sample the analog signal X(•) at a sampling rate $f_{DR}$ to generate a discrete-time signal Y[•]. That is, the sampler 110 may sample the analog signal X(•) at each sampling interval $$T = \frac{1}{f_{DR}}$$

(e.g., every x microseconds). The discrete-time signal Y[.] may include a sample of the analog signal X(•) at each sampling interval $$T = \frac{1}{f_{DR}}.$$

The sampler 110 may be configured to apply uniform and/or non-uniform sampling without departing from the scope of the present disclosure. For instance, when uniform sampling is used, each sampling interval T may have an equal length or duration $$\left(\text{e.g., } T = \frac{1}{f_{DR}}\right).$$

By contrast, if non-uniform sampling is used, at least some sampling intervals may be different in length or duration. Accordingly, the sampling rate $f_s$ may be replaced with a sampling density.

In some example embodiments, the encoder 120 may be configured to encode each sample of the analog signal X(•) present in the discrete-time signal Y[•]. The encoder 120 may be configured to encode the discrete-time signal Y[•] at a quantization rate q. For example, the encoder 120 may use a q quantity of bits to encode each sample of the analog signal X(•) present in the discrete-time signal Y[•]. Encoding the discrete-time signal Y[•] generates the digital signal Y[n] that is output by the analog-to-digital converter 100.

In some example embodiments, the performance of the analog-to-digital converter may be subject to a bitrate constraint R (e.g., as a result of hardware limitations). The bitrate constraint R may be defined as follows:

$$R = f_{DR} \times q,$$

wherein $f_{DR}$ may be the sampling rate at the sampler 110 and q may be the quantization rate of the encoder 120.

The operations of both the sampler 110 and the encoder 120 in converting the analog signal X(•) may introduce distortion. That is, converting the analog signal X(•) to the digital signal Y[n] may preserve some but not all of the information conveyed in the analog signal X(•). Accordingly, the bitrate constraint R may be a function of the sampling rate $f_{DR}$ applied at the sampler 110. Moreover, the bitrate constraint R may also reflect the lossy nature of encoder 120. Converting the analog signal X(•) may introduce a total distortion $D_X$ that is a function of the bitrate constraint R (e.g., $D_X(R)$). For example, an analog signal $\hat{X}(•)$ reconstructed from the digital signal Y[n] (e.g., by a digital-to-analog converter 130) may exhibit a total distortion $D_X(R)$.

The total distortion $D_X(R)$ may be subject to a lower bound $\underline{D}_X$ representative of the minimal distortion achievable by the analog-to-digital converter 100 given the bitrate constraint R. That is, given the bitrate constraint R, the analog signal $\hat{X}(•)$ reconstructed from the digital signal Y[n] (e.g., by the digital-to-analog converter 130) may exhibit a minimal distortion $\underline{D}_X$, which may not be improved and/or eliminated by sampling at a sampling rate at or above the Nyquist rate $f_{Ny}$. Meanwhile, sampling at an optimal sampling rate $f_{DR}$ lower than the Nyquist rate $f_{Ny}$ may not increase an amount of lost or discarded information from the analog signal X(•) lost. Hence, the sampler 110 may be configured to sample at the optimal sampling rate $f_{DR}$ without increasing the total distortion $D_X(R)$ above the lower bound $\underline{D}_X$.

Figure 2:
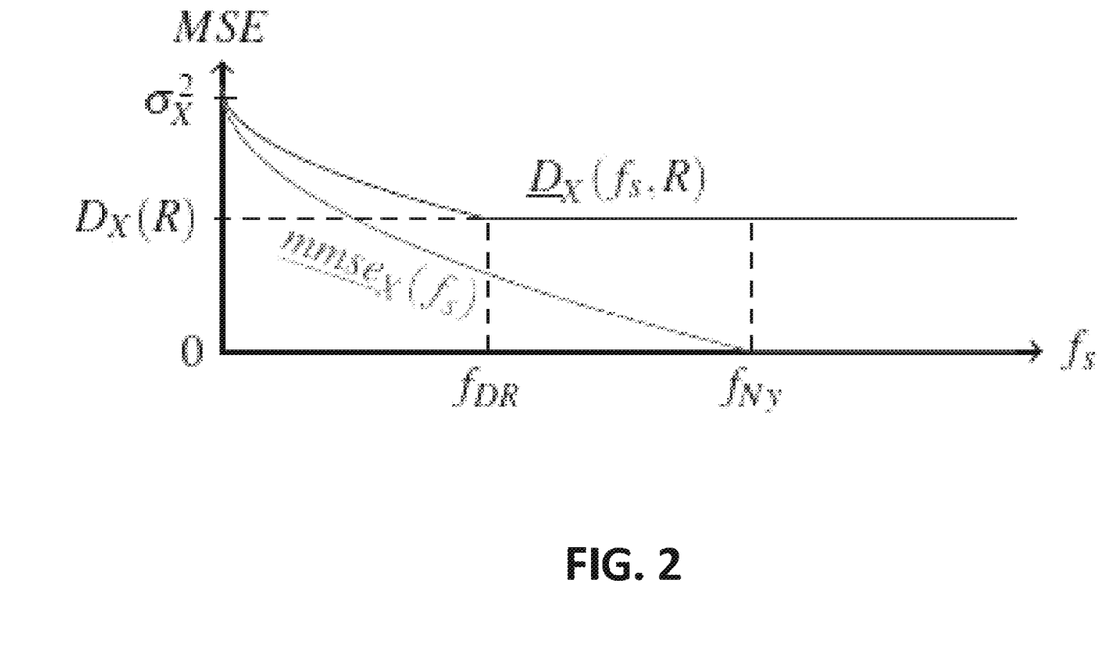
FIG. 2 depicts a graph illustrating distortion as a function of sampling rate, in accordance with some example embodiments.

FIG. 2 depicts a graph illustrating distortion as a function of sampling rate, in accordance with some example embodiments. Referring to FIGS. 1-2, distortion may be measured as the fidelity (e.g., mean squared error) of the digital signal Y[n] in representing the original analog signal X(•).

In some example embodiments, the lower bound $\underline{D}_X(f_s, R)$ may represent the minimal distortion achievable by the analog-to-digital converter 100 at a bitrate constraint R. The lower bound $\underline{D}(f_s, R)$ may be a function of the sampling rate $f_s$ and the bitrate constraint R of the analog-to-digital converter 100. As shown in FIG. 2, given the bitrate constraint R, the total distortion $D_X(R)$ of the analog-to-digital converter 100 may not be improved beyond the lower bound $\underline{D}(f_s, R)$, even when the sampling rate $f_s$ is equal to or exceeds the Nyquist rate $f_{Ny}$. Otherwise stated, a minimal distortion as indicated by the lower bound $\underline{D}(f_s, R)$ may be achieved even when sampling below the $f_s$ the Nyquist rate $f_{Ny}$ (e.g., at the optimal sampling rate $f_{DR}$).

By contrast, the distortion achievable in accordance the Shannon-Nyquist theorem may be characterized as follows:

$$\text{msse}_X(f_s) = \lim_{R \to \infty} D_X(f_s, R)$$

Specifically, the Shannon-Nyquist theorem may disregard the distortion (e.g., the minimal distortion corresponding to the lower bound $\underline{D}_X(f_s, R)$) introduced by the encoding of analog signal X(•). Thus, as shown in FIG. 2, the Shannon-Nyquist theorem posits that perfect reconstruction may be achieved (e.g., without any minimal distortion or alias) by sampling at or above the Nyquist rate $f_{Ny}$.

Figure 3:
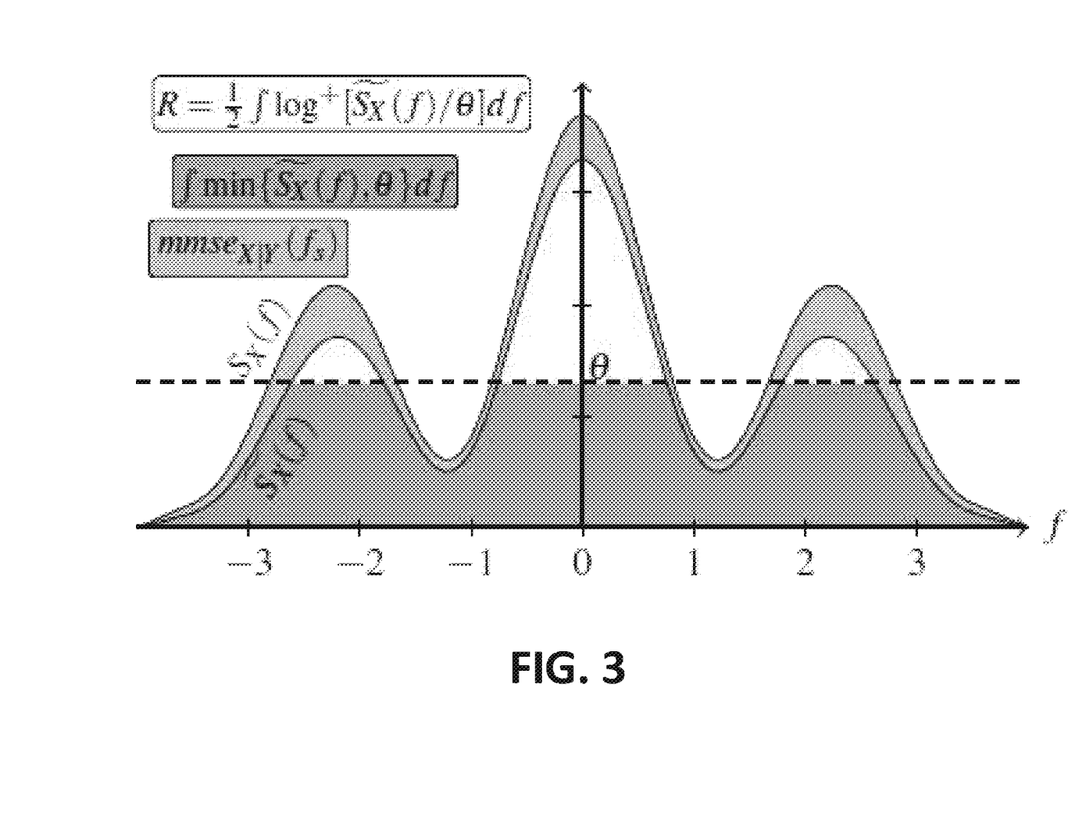
FIG. 3 depicts a graph illustrating a power density spectrum, in accordance with some example embodiments.

FIG. 3 depicts a graph illustrating a power density spectrum, in accordance with some example embodiments. Referring to FIGS. 1 and 3, the analog signal X(•) may be a real Gaussian stationary process with the following power spectral density:

$$S_X(f) \triangleq \int_{-\infty}^{\infty} \mathbb{E}[X(t-\tau)X(t)] e^{-2\pi i \tau f} d\tau$$

The variance of the analog signal X(•) may be characterized as follows:

$$\sigma_X^2 \triangleq \int_{-\infty}^{\infty} S_X(f) df < \infty$$

The analog-to-digital converter 100 (e.g., the sampler 110) may receive the analog signal X(•) as an input and produce a discrete-time signal Y[•], where the discrete-time signal Y[•] may be defined as follows:

$$Y[•] = \{Y[n], n \in \mathbb{Z}\}$$

The distortion between the analog signal X(•) and the reconstructed analog signal $\hat{X}$(•) may be given by the following:

$$d(X(\cdot), \hat{X}(\cdot)) = \lim_{T \to \infty} \frac{1}{2T} \int_{-T}^{T} (X(t) - (\hat{X}(t))^2 dt$$

The indirect distortion-rate function $D_{X|Y}(f_s, R)$ of X(•) given the discrete-time signal Y[•] may be defined to be the following minimal average quadratic distortion:

$$D_{X|Y}(f_s, R) = \inf_{Y \xrightarrow{R} \hat{X}} \mathbb{E} d(X(\cdot), \hat{X})$$

wherein the infimum is taken over all mappings from the discrete-time signal Y[•] to the reconstructed analog signal $\hat{X}$(•) such that the mutual information rate I(Y[•]; $\hat{X}$(•)) is limited to $$\frac{R}{f_s}$$

bits per sample, and wherein $f_s$ is the average sampling rate applied at the analog-to-digital on i converter 100 (e.g., the sampler 110).

The indirect distortion-rate function $D_{X|Y}(f_s, R)$ may depend on the sampling mechanism applied by the analog-to-digital converter 100. Thus, where the sampler 110 samples at uniform intervals without a preprocessor (e.g., Y[n]=X (n/$f_s$) for all n∈ℤ), the indirect distortion-rate of $\hat{X}$(•) may be given as follows:

$$R(\theta) = \frac{1}{2} \int_{-f_s/2}^{f_s/2} [\log \widetilde{S}_X(f)/\theta]^+ df,$$

$$D_{X|Y}(\theta) = \sigma_X^2 - \int_{-f_s/2}^{f_s/2} \left[\frac{\widetilde{S}_X(f)}{\theta}\right]^+ df,$$

wherein $[x]^+ = \max\{0, x\}$ and $$\widetilde{S}_X(f) = \frac{\sum_{k \in \mathbb{Z}} S_X^2(f - f_s k)}{\sum_{k \in \mathbb{Z}} S_X(f - f_s k)}$$

If the support of $S_X(f)$ is within the interval $(-f_s/2, f_s/2)$, then $\widetilde{S}_X(f) = S_X(f)$[1] and the expressions for $R(\theta)$ and $D_{X|Y}(\theta)$ may be reduced to the following:

The expression for $\tilde{S}_X(f)$ may be interpreted as zero when both the numerator and the dominator are zero.

$$R(\theta) = \frac{1}{2} \int_{-\infty}^{\infty} \log^+ [S_X(f)/\theta] df,$$

$$D_X(\theta) = \int_{-\infty}^{\infty} \min\{S_X(f), \theta\} df$$

Alternately, when R→∞, then the expression for the indirect distortion-rate function $D_{X|Y}(f_s, R)$ may be reduced to the minimal mean squared error $mmse_{x|y}$ achievable in estimating the original analog signal X(•) from its samples.

The minimal mean squared error may be defined as follows:

$$mmse_{X|Y} = \sigma_X^2 - \int_{-f_s/2}^{f_s/2} \overline{S_X}(f) df$$

Figure 4:
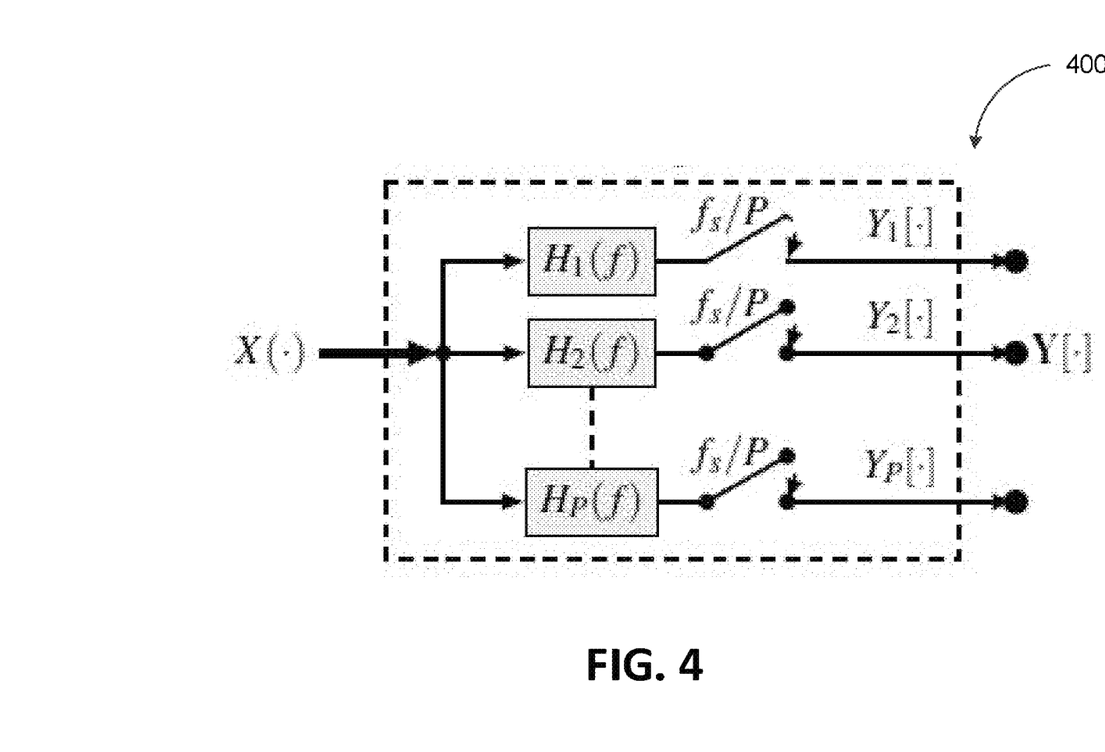
FIG. 4 depicts a block diagram illustrating a filter-bank sampler, in accordance with some example embodiments.

FIG. 4 depicts a block diagram illustrating a filter-bank sampler 400, in accordance with some example embodiments. Referring to FIGS. 1 and 4, the filter-bank sampler 400 may implement the sampler 110 of the analog-to-digital converter 100.

As shown in FIG. 4, the filter-bank sampler 400 may include a P quantity of sampling branches. Each sampling branch may be associated with one of a P quantity of pre-sampling filters $H_p(f)$ (e.g., $H_1(f), H_2(f), \ldots, H_P(f)$). Moreover, each sampling branch may be associated with a sampler that samples at a sampling rate $f_s/P$. Accordingly, the filter-bank sampler 400 may sample the analog signal X(•) and provide (e.g., to the encoder 120) a P quantity of discrete-time signals $Y_P[n]$ defined as follows:

$$Y_P[n] \triangleq \int_{-\infty}^{\infty} h_i\left(\frac{nP}{f_s} - \tau\right) X(\tau) d\tau$$

Given the power density spectrum $S_X(f)$ of the analog signal X(•), and the bitrate constraint R and the sampling rate $f_s$ of the analog-to-digital converter 100, the total distortion $D_X(R)$ may be reduced by an optimal selection of the pre-sampling filters $H_1(f), H_2(f), \ldots, H_P(f)$. In some example embodiments, the pre-sampling filter may be selected in order to eliminate distortion at each of the P quantity of sampling branches and to pass the portion of the analog signal X(•) having the highest energy. As the quantity of sampling branches approaches infinity (e.g., P→∞), the portion of the analog signal X(•) that pass through the pre-sampling filters unblocked may be a set $F^*(f_s)$ of frequencies $f_s$ having the highest energy. The lower bound $\underline{D}_X(f_s, R)$ representative of the minimal distortion achievable by the analog-to-digital converter 100 may be denoted as follows:

$$\underline{D}_X(f_s, R) \triangleq \lim_{P \to \infty} D_X^*(P, f_s, R)$$

Figure 5:
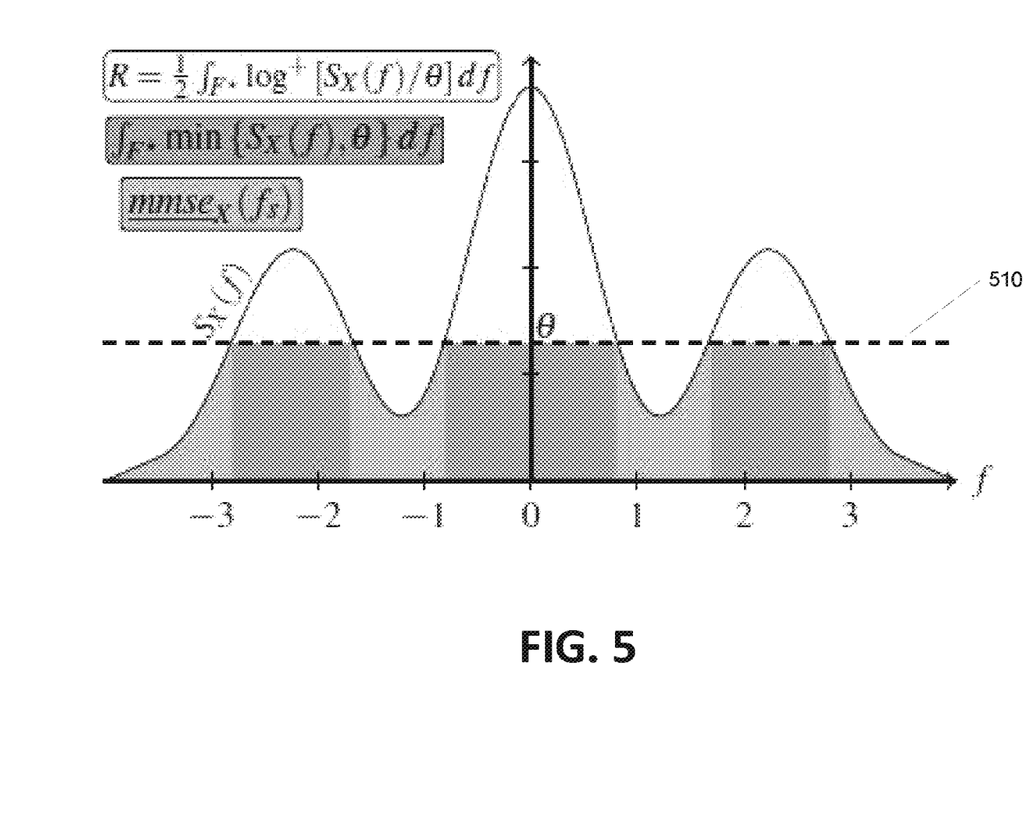
FIG. 5 depicts a graph illustrating a power density spectrum, in accordance with some example embodiments.

FIG. 5 depicts a graph illustrating a power density spectrum, in accordance with some example embodiments. Referring to FIGS. 1 and 4-5, the lower bound $\underline{D}_X(f_s, R)$ associated with the filter-bank sampler 400 may be expressed as follows:

$$R(\theta) = \frac{1}{2} \int_{F^*(f_s)} \log^+ \left[\frac{S_X(f)}{\theta}\right] df,$$

$$D_X(f_s, \theta(R)) = \underline{mmse}_X(f_s) + \int_{F^*(f_s)} \min\{S_X(f), \theta\} df$$

$$= \sigma_X^2 - \int_{F^*(f_s)} [S_X(f) - \theta]^+ df,$$

wherein the set $F^*(f_s)$ maximizes the integral $\int_F S_X(f) df$ over all measureable sets F∈ℝ of Lebesgue measure not exceeding $f_s$.

The minimal mean squared error in estimating the original analog signal X(•) from samples provided by the filter-bank sampler 400 operating at a sampling rate $f_s$ may be expressed as follows:

$$mmse_X(f_s) \triangleq \sigma_X^2 - \int_{F^*(f_s)} S_X(f) df = \int_{R \setminus F^*(f_s)} S_X(f) df$$

Referring to FIG. 5, the minimal distortion achievable by the analog-to-digital converter 100 may be dependent on the water level 510. The portion of the analog signal X(•) above the water level 510 may be preserved through encoding (e.g., by the encoder 120) while the portion of the analog signal X(•) below the water level 510 may be discarded as a result of encoding. Moreover, the bitrate constraint R of the analog-to-digital converter 100 may be a function of the water level 510. As such, adapting the bitrate constraint R may engender a corresponding adjustment in the level of the water level 510 and a minimal distortion achievable by the analog-to-digital converter 100.

Figure 6:
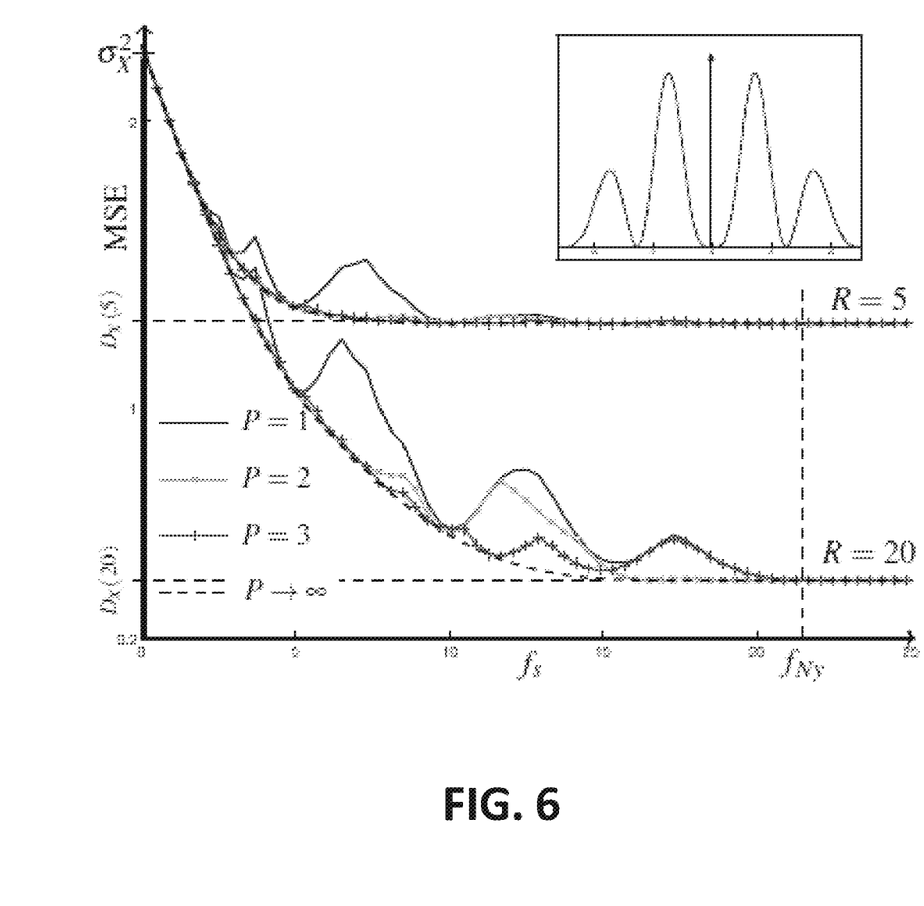
FIG. 6 depicts a graph illustrating distortion as a function of sampling rate, in accordance with some example embodiments.

FIG. 6 depicts a graph illustrating distortion as a function of sampling rate, in accordance with some example embodiments. Referring to FIGS. 1 and 6, the distortion achievable by the analog-to-digital converter 100 may change when the bitrate of the analog-to-digital converter 100 adapts its bitrate constraint R to different values (e.g., R=5 and R=20). FIG. 6 further shows the distortion achievable by the analog-to-digital converter 100 when a different number P of pre-sampling branches are available at the analog-to-digital converter 100 (e.g., the sampler 110).

In some example embodiments, the distortion introduced by the analog-to-digital converter 100 is dependent on the bitrate constraint R. Notably, the distortion introduced may converge to a minimal distortion (e.g., $\underline{D}_X(f_s, R)$) that is achievable given a particular bitrate constraints R. For instance, the minimal distortion achievable when R=5 may be greater than the minimal distortion achievable when R=20. Moreover, the distortion introduced at different bitrate constraints R all converge (e.g., to a minimal distortion $\underline{D}_X(f_x, R)$) as the number P of pre-sampling branches increases. As shown in FIG. 6, given different bitrate constraints R, as the number P of pre-sampling branches increases (e.g., P→∞), the distortion introduced may nevertheless converge (e.g., to a minimal distortion $\underline{D}_X(f_s, R)$) at a sampling rate that is lower than the Nyquist rate $f_{Ny}$.

Figure 7:
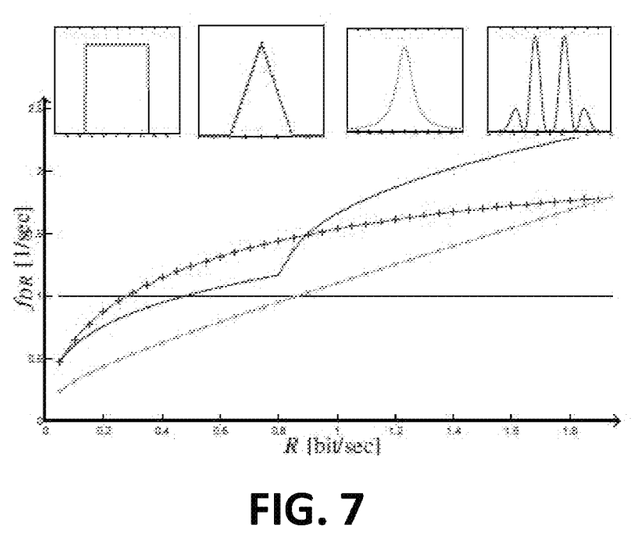
FIG. 7 depicts a graph illustrating optimal sampling rate as a function of bitrate, in accordance with some example embodiments.

FIG. 7 depicts a graph illustrating optimal sampling rate as a function of bitrate, in accordance with some example embodiments. Referring to FIGS. 1 and 7, the analog-to-digital converter 100 may sample at the optimal sampling rate $f_{DR}$ in order to achieve the minimal distortion $\underline{D}_X(f_x, R)$ given a bitrate constraint R. Varying the bitrate constraint R may change the optimal sampling rate $f_{DR}$ required to achieve the minimal distortion $\underline{D}_X(f_s, R)$ given the bitrate constraint R. Moreover, as shown in FIG. 7, the bitrate constraint R may also vary depending on the power spectral density of the analog signal X(•). For instance, the bitrate constraint R may vary based a uniformity of the distribution of energy across the different frequencies of the analog signal X(•). Accordingly, encoding a signal that is more stable or constant in its power distribution may require a lower bitrate than encoding a signal having a more volatile power distribution.

Figure 8:
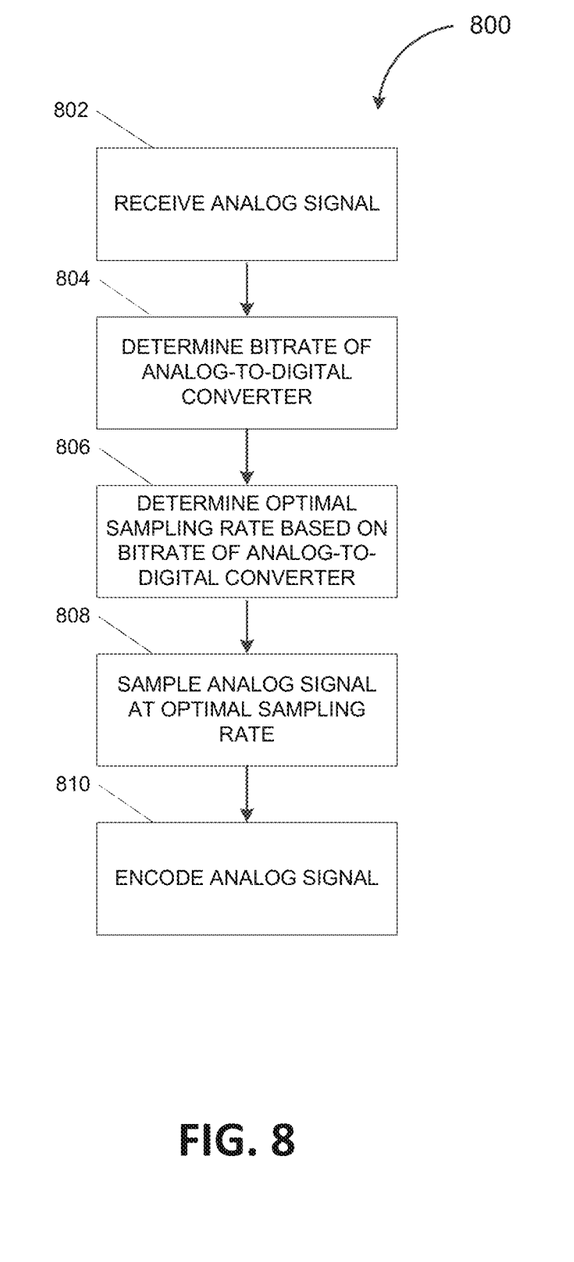
FIG. 8 depicts a flowchart illustrating a process for analog-to-digital conversion, in accordance with some example embodiments.

FIG. 8 depicts a flowchart illustrating a process 800 for analog-to-digital conversion, in accordance with some example embodiments. Referring to FIGS. 1 and 8, the process 800 may be performed by the analog-to-digital converter 100.

At 802, the analog-to-digital converter 100 may receive an analog signal X(•).

At 804, the analog-to-digital converter 100 may determine a bitrate associated with the analog-to-digital converter 100. In some example embodiments, the bitrate of the analog-to-digital converter 100 may be subject to a bitrate constraint R. The bitrate constraint R may be a function of the coding or quantization rate q of the encoder 120 (e.g., $R = f_s \times q$). As such, when the analog-to-digital converter 100 is subject to the bitrate constraint R, the analog-to-digital converter 100 may use a corresponding q quantity of bits to encode each sample of the analog signal X(•).

Alternately or additionally, the analog-to-digital converter 100 may adapt the bitrate constraint R based on the analog signal X(•). In some example embodiments, adapting the bitrate constraint R may adjust the portion of the analog signal X(•) that is preserved (or discarded) as a result of encoding. Accordingly, the analog-to-digital converter 100 may adapt the bitrate constraint R based on the power spectral density of the analog signal X(•). The analog-to-digital converter 100 may relax the bitrate constraint R (e.g., increase the value of R) when the energy of the analog signal X(•) is distributed unevenly across its frequencies. By contrast, the analog-to-digital converter 100 may tighten the bitrate constraint R (e.g., decrease the value of R) when the energy of the analog signal X(•) is more uniformly distributed across its frequencies.

In some example embodiments, the analog-to-digital converter 100 may receive one or more feedback from a receiver of the digital signal Y[n] (e.g., the digital-to-analog converter 130). The feedback from the receiver may provide an indication of the distortion present in an analog signal $\hat{X}(•)$ reconstructed from the digital signal Y[n]. For example, the analog-to-digital converter 100 may receive feedback indicating a level of distortion. Alternately or additionally, the analog-to-digital converter 100 may receive feedback indicating that the level of distortion exceeds a threshold. Based on the feedback, the analog-to-digital converter 100 may adjust the bitrate constraint R. For example, the analog-to-digital converter 100 may relax the bitrate constraint R (e.g., use a higher quantity of bits to encode the analog signal X(•)) when the feedback indicates that a level of distortion is high and/or exceeds a threshold.

At 806, the analog-to-digital converter 100 may determine an optimal sampling rate $f_{DR}$ based on the bitrate of the analog-to-digital converter 100. As the bitrate of the analog-to-digital converter 100 may reflect one or more limitations (e.g., hardware) of the analog-to-digital converter 100, the bitrate of the digital-to-analog converter 100 may correspond (e.g., be inversely proportional) to a minimal distortion $\underline{D}_X$ achievable by the digital-to-analog converter 100. The optimal sampling rate $f_{DR}$ may be a sampling rate below the Nyquist rate. However, sampling at the optimal sampling rate $f_{DR}$ may not introduce any distortion in addition to the minimal distortion $\underline{D}_X$ achievable by the digital-to-analog converter 100. Accordingly, the optimal sampling rate $f_{DR}$ may be a sampling rate that achieves the minimal distortion $\underline{D}_X$ achievable by the digital-to-analog converter 100 given the bitrate of the analog-to-digital converter 100.

For example, when the analog-to-digital converter 100 has a higher bitrate (e.g., is subject to a higher bitrate constraint R), the analog-to-digital converter 100 may use a larger quantity of bits to encode each sample of the analog signal X(•) thereby decreasing the distortion associated with encoding the analog signal X(•). Accordingly, the digital-to-analog converter 100 may be able to achieve a lower minimal distortion $\underline{D}_X$ when the digital-to-analog converter 100 has a higher bitrate. As a result, the optimal sampling rate $f_{DR}$ may be higher in order to for the analog-to-digital converter to achieve the minimal distortion $\underline{D}_X$ while sampling the analog signal X(•) at the optimal sampling rate $f_{DR}$.

At 808, the analog-to-digital converter 100 may sample the analog signal X(•) at the optimal sampling rate $f_{DR}$. The optimal sampling rate $f_{DR}$ may be determined based on a bitrate constraint R of the analog-to-digital converter 100. Sampling the analog signal X(•) may generate a discrete-time signal Y[•], wherein Y[n]=X(n/$f_{DR}$) for all n∈ℤ.

In some example embodiments, the analog-to-digital converter 100 may introduce distortion when converting the analog signal X(•). However, a total amount of distortion $D_X$ introduced by the analog-to-digital converter 100 may be subject to a lower bound $\underline{D}_X$ given the bitrate constraint R. This minimal distortion may not be improved upon and/or eliminated, such as by sampling at a higher frequency (e.g., at the Nyquist rate $f_{Ny}$). As such, given the bitrate constraint R, the analog-to-digital converter 100 may sample the analog signal X(•) at the optimal sampling rate $f_{DR}$, which may be below the Nyquist rate $f_{Ny}$, without introducing additional distortion beyond the lower bound $\underline{D}_X$ associated with the bitrate constraint R.

At 810, the analog-to-digital converter 100 may encode the analog signal X(•). In some example embodiments, the analog-to-digital converter 100 (e.g., the encoder 120) may encode the analog signal X(•) by applying a quantizer to each sample of the analog signal X(•) present in the discrete-time signal Y[•]. For example, the analog-to-digital converter 100 may apply a simple scalar quantizer or a more optimal vector quantizer. However, any quantizer (e.g., optimal or suboptimal) may be applied without departing from the scope of the present disclosure.

The analog-to-digital converter 100 may encode the analog signal X(•) at a quantization rate q. For example, the quantization rate q may correspond to a q quantity of bits used to encode each sample of the analog signal X(•) that is present in the discrete-time signal Y[•]. According to some example embodiments, the quantization rate q may vary based on the bitrate constraint R of the analog-to-digital converter 100. That is, the relationship between the quantization rate q may vary based on the bitrate constraint R may be expressed as follows:

$$q = \frac{R}{f_s}$$

Thus, given a particular sampling rate (e.g., the optimal sampling rate $f_{DR}$), increasing the bitrate constraint R may also increase the quantization rate q while decreasing the bitrate constraint R may also decrease the quantization rate q.

One or more aspects or features of the subject matter described herein can be realized in digital electronic circuitry, integrated circuitry, specially designed application specific integrated circuits (ASICs), field programmable gate arrays (FPGAs) computer hardware, firmware, software, and/or combinations thereof. These various aspects or features can include implementation in one or more computer programs that are executable and/or interpretable on a programmable system including at least one programmable processor, which can be special or general purpose, coupled to receive data and instructions from, and to transmit data and instructions to, a storage system, at least one input device, and at least one output device. The programmable system or computing system may include clients and servers. A client and server are generally remote from each other and typically interact through a communication network. The relationship of client and server arises by virtue of computer programs running on the respective computers and having a client-server relationship to each other.

These computer programs, which can also be referred to as programs, software, software applications, applications, components, or code, include machine instructions for a programmable processor, and can be implemented in a high-level procedural and/or object-oriented programming language, and/or in assembly/machine language. As used herein, the term "machine-readable medium" refers to any computer program product, apparatus and/or device, such as for example magnetic discs, optical disks, memory, and Programmable Logic Devices (PLDs), used to provide machine instructions and/or data to a programmable processor, including a machine-readable medium that receives machine instructions as a machine-readable signal. The term "machine-readable signal" refers to any signal used to provide machine instructions and/or data to a programmable processor. The machine-readable medium can store such machine instructions non-transitorily, such as for example as would a non-transient solid-state memory or a magnetic hard drive or any equivalent storage medium. The machine-readable medium can alternatively, or additionally, store such machine instructions in a transient manner, such as for example, as would a processor cache or other random access memory associated with one or more physical processor cores.

To provide for interaction with a user, one or more aspects or features of the subject matter described herein can be implemented on a computer having a display device, such as for example a cathode ray tube (CRT) or a liquid crystal display (LCD) or a light emitting diode (LED) monitor for displaying information to the user and a keyboard and a pointing device, such as for example a mouse or a trackball, by which the user may provide input to the computer. Other kinds of devices can be used to provide for interaction with a user as well. For example, feedback provided to the user can be any form of sensory feedback, such as for example visual feedback, auditory feedback, or tactile feedback; and input from the user may be received in any form, including, but not limited to, acoustic, speech, or tactile input. Other possible input devices include, but are not limited to, touch screens or other touch-sensitive devices such as single or multi-point resistive or capacitive track pads, voice recognition hardware and software, optical scanners, optical pointers, digital image capture devices and associated interpretation software, and the like.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and subcombinations of the disclosed features and/or combinations and subcombinations of several further features disclosed above. In addition, the logic flows depicted in the accompanying figures and/or described herein do not necessarily require the particular order shown, or sequential order, to achieve desirable results. Other implementations may be within the scope of the following claims.

What is claimed is:

1. A system, comprising:
   at least one processor; and
   at least one memory including program code which when executed by the at least one memory provides operations comprising:
   receiving, at an analog-to-digital converter, an analog signal;
   determining, based on a total distortion caused by at least a sampler and an encoder, a sampling rate below the Nyquist rate and
   converting, by the analog-to-digital converter, the received analog signal to a digital signal by at least sampling at the determined sampling rate, when operation at the determined sampling rate does not worsen the total distortion.

2. The system of claim 1, further comprising:
   determining, based on the total distortion, a quantization rate; and
   converting, by the analog-to-digital converter, the received analog signal to the digital signal by at least encoding at the determined quantization rate.

3. The system of claim 1, wherein the analog-to-digital converter comprises the sampler and the encoder.

4. The system of claim 1, wherein the total distortion includes a first distortion associated with the sampling of the analog signal and a second distortion associated with the encoding of the analog signal.

5. The system of claim 4, wherein the second distortion associated with the encoding of the analog signal represents a minimal distortion achievable by the analog-to-digital converter.

6. The system of claim 5, wherein the minimal distortion corresponds to an operating point at which the sampling rate does not worsen the total distortion.

7. The system of claim 1, wherein the encoder quantizes a sampled representation of the received analog signal.

8. The system of claim 7, wherein the encoder comprises a scaler quantizer and/or a vector quantizer.

9. The system of claim 1, wherein a bitrate of the analog-to-digital converter is a function of the sampling rate of the sampler and the quantization rate of the encoder.

10. The system of claim 1 further comprising:
    determining the total distortion based on feedback representative of a distortion of the decoded digital signal and/or an error of the decoded digital signal.

11. The system of claim 1, further comprising:
    determining, based on the feedback, an adapted sampling rate below the Nyquist rate such that operation at the adapted sampling rate does not worsen the total distortion caused by the sampler and the encoder; and
    converting the received analog signal by at least sampling at the adapted sampling rate.

12. A method, comprising:
    receiving, at an analog-to-digital converter, an analog signal;
    determining, based on a total distortion caused by at least a sampler and an encoder, a sampling rate below the Nyquist rate; and
    converting, by the analog-to-digital converter, the received analog signal to a digital signal by at least sampling at the determined sampling rate, when operation at the determined sampling rate does not worsen the total distortion.

13. The method of claim 12, further comprising:
    determining, based on the total distortion, a quantization rate; and
    converting, by the analog-to-digital converter, the received analog signal to the digital signal by at least encoding at the determined quantization rate.

14. The method of claim 12, wherein the total distortion includes a first distortion associated with the sampling of the analog signal and a second distortion associated with the encoding of the analog signal.

15. The method of claim 14, wherein the second distortion associated with the encoding of the analog signal represents a minimal distortion achievable by the analog-to-digital converter.

16. The method of claim 15, wherein the minimal distortion corresponds to an operating point at which the sampling rate does not worsen the total distortion.

17. The method of claim 12, wherein the encoder applies a scaler quantizer and/or a vector quantizer to quantize a sampled representation of the received analog signal.

18. The method of claim 12, further comprising:
    determining the total distortion based on feedback representative of a distortion of the decoded digital signal and/or an error of the decoded digital signal.

19. The method of claim 12, further comprising:
    determining, based on the feedback, an adapted sampling rate below the Nyquist rate such that operation at the adapted sampling rate does not worsen the total distortion caused by the sampler and the encoder; and
    converting the received analog signal by at least sampling at the adapted sampling rate.

20. A non-transitory computer-readable storage medium including program code which when executed by at least one processor causes operations comprising:
    receiving, at an analog-to-digital converter, an analog signal;
    determining, based on a total distortion caused by at least a sampler and an encoder, a sampling rate below the Nyquist rate; and
    converting, by the analog-to-digital converter, the received analog signal to a digital signal by at least sampling at the determined sampling rate, when operation at the determined sampling rate does not worsen the total distortion.

* * * * *